(12) United States Patent
Zappa et al.

(10) Patent No.: US 7,284,166 B2
(45) Date of Patent: Oct. 16, 2007

(54) PROGRAMMABLE MULTI-MODE BUILT-IN SELF-TEST AND SELF-REPAIR STRUCTURE FOR EMBEDDED MEMORY ARRAYS

(75) Inventors: Rita Zappa, Milan (IT); Carolina Selva, Cologno Monzese (IT); Danilo Rimondi, Mozzo (IT); Cosimo Torelli, Cernusco sul Naviglio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 186 days.

(21) Appl. No.: 11/197,989

(22) Filed: Aug. 5, 2005

(65) Prior Publication Data

US 2006/0031726 A1 Feb. 9, 2006

(30) Foreign Application Priority Data

Aug. 6, 2004 (EP) .................................. 04425617

(51) Int. Cl.
*G11C 29/00* (2006.01)
(52) U.S. Cl. ..................... 714/710; 714/718; 714/733
(58) Field of Classification Search ................ 365/200, 365/201; 714/725, 710, 718, 733
See application file for complete search history.

(56) References Cited

U.S. PATENT DOCUMENTS

| | | | | |
|---|---|---|---|---|
| 5,535,164 A * | 7/1996 | Adams et al. | ............... | 365/201 |
| 5,577,050 A * | 11/1996 | Bair et al. | ................... | 714/710 |
| 5,862,151 A | 1/1999 | Fagerness | ................... | 371/22.5 |
| 6,141,779 A | 10/2000 | Hill et al. | ................... | 714/710 |
| 6,151,692 A * | 11/2000 | Smitlener et al. | ........... | 714/718 |
| 6,493,839 B1 | 12/2002 | Miner | ......................... | 714/718 |
| 6,839,873 B1 * | 1/2005 | Moore | ......................... | 714/725 |
| 7,073,112 B2 * | 7/2006 | Chai et al. | ................... | 714/733 |
| 7,187,603 B2 * | 3/2007 | Nagata et al. | ............... | 365/200 |
| 2002/0174382 A1 | 11/2002 | Ledford et al. | ............... | 714/30 |

FOREIGN PATENT DOCUMENTS

EP 1369878 12/2003

OTHER PUBLICATIONS

Benso et al., Programmable Built-In Self-Testing of Embedded RAM Clusters in System-On-Chip Architectures, IEEE Communications Magazine, IEEE Service Center, Piscataway, NJ, US, vol. 41, No. 9, Sep. 2003, pp. 90-97.

* cited by examiner

*Primary Examiner*—David Ton
(74) *Attorney, Agent, or Firm*—Lisa K. Jorgenson; Allen, Dyer, Doppelt, Milbrath & Gilchrist, P.A.

(57) ABSTRACT

A built-in self-test and self-repair structure (BISR) of memory arrays embedded in an integrated device includes at least a test block (BIST) programmable to execute on a respective memory array of the device any of a certain number of test algorithms, and a self-repair block that includes a column address generator processing the faulty address information for allocating redundant resources of the tested memory array. The BISR may further include a redundancy register on which final redundancy information is loaded at each power-on of the device and control logic for managing data transfer from external circuitry to the built-in self-test and self-repair structure (BISR) and vice versa. The BIST structure serves any number of embedded memory arrays even of different types and sizes.

19 Claims, 7 Drawing Sheets

PROGRAMMABLE MULTI-MODE BUILT-IN SELF-TEST AND SELF-REPAIR STRUCTURE FOR EMBEDDED MEMORY ARRAYS

FIELD OF THE INVENTION

The present invention relates, in general, to the testing and repair of embedded memories in system-on-chip or similar devices. More particularly, it relates to a built-in self repair architecture for testing and repairing embedded RAMs in a system comprising also nonvolatile memories.

BACKGROUND OF THE INVENTION

Embedded Random Access Memories (RAMs) have come to be one of the densest blocks in modern complex devices of which the so-called System-on-Chip (SoC) devices are significant examples. A direct consequence of the high level of integration of these complex devices is a high probability of defects inside these extremely compact on-board data storage subsystems. Redundant structures have therefore become a desired feature for embedded memories to achieve high production yields.

Moreover, to enhance productivity by reducing the time required for testing embedded memory arrays of increasingly large capacities and for establishing the required substitution with redundant resources of memory addresses found faulty, many Built-In Self Repair (BISR) structures have been proposed. For example T. Chen, G. Sunada in "A Self-testing and Self-Repairing Structure for Ultra-large Capacity Memories", 1992, International Test Conference; Kim, Y. Zorian, G. Komoriya, H. Pham, F. P. Higgins, J. L. Lewandowski, in "Built In Self Repair for Embedded High Density SRAM", International Test Conference, 1998, pp. 1112-1119; and A. Benso, S. Chiusano, G. Di Natale, P. Prinetto, in "An on-line BIST RAM Architecture with Self-Repair Capabilities", 2002, IEEE Transactions on Reliability, Volume 51, pp. 123-128 each discloses a software post-fabrication repair approach. R. J. McPartland, D. J. Loeper, F. P. Higgins, R. Singh, G. MacDonald, G. Komoriya, S. Aymeloglu, M. V. DePaolis, C. W. Leung, in "SRAM Embedded Memory with Low Cost, FLASH EEPROM-Switch-Controlled Redundancy", 2000, IEEE Custom Integrated Circuits Conference, pp. 287-289; and M. Yamaoka, K. Yangisawa, S. Shukuri, K. Norisue, K. Ishibashi, in "A System LSI Memory Redundancy Technique Using an ie-Flash (inverse-gate-electrode Flash) Programming Circuit", 2001, Symposium on VLSI Circuits Digest of Technical Papers, pp. 71-72 outline a hardware post-fabrication repair approach.

In the newest fabrication technologies, with extremely reduced spacing, many types of complex cell-interaction faults are frequently occurring rather than and in addition to simple stuck-at faults. Therefore, it has become of importance to exhaustively test a memory to discover and localize such complicated fault mechanisms by using appropriate test patterns.

Most of state-of-the-art SoC designs may have as much as 40 to 80 percent of total chip area dedicated to memory arrays, which can be present in one or more of types such as: FLASH, SRAM, ROM, DRAM, according to the complexity of the technology.

Intuitively, post-fabrication repair of an embedded RAM array may be facilitated if the device includes also at least a nonvolatile memory array, because a failed RAM address identified during a built-in self-test (BIST) session may be eventually stored there. Alternatively, a dedicated ROM array may be integrated for covering the permanent storage needs of a BISR structure.

In general, the testing of embedded RAM memories is carried out by employing a programmable built-in self-test (BIST) circuit capable of generating different test patterns to ensure a flexible trade-off between testing time and test coverage of the array cells. However, these BIST structures, despite their programmability, are necessarily tailored for specific memory array aspect ratios and dimensions.

In other words, if the device includes distinct RAM arrays of different sizes, a dedicated BIST module for each of them is normally required, implying an increased cost and complexity.

There are no BISR architectures capable of producing diagnostic information on the reasons why an embedded memory array having a certain inventory of redundancy structures are not repairable.

On the other hand, the testing done during a silicon qualification of a new device prototype is not only oriented to verify the functionality, but also to identify process weaknesses that are responsible for memory cell faults. In this prototyping context even if a certain embedded memory array is not repairable, the test engineer may be interested to know if the irremediable failure has occurred because the redundancy capacity has been exceeded or because the nonvolatile memory in which the substituted addresses are stored is not working correctly.

When a new device has entered the mass production stage, there can be sudden yield drops. In these cases, it may be important to be able to identify in which type of memory array the failures have started to occur. This can be done by gathering separate information on an increasing number of malfunctions occurring either in an embedded RAM array or in an embedded nonvolatile memory array.

Of course, these investigations may be conducted on the devices through appropriate test programs using special external test set-ups, however these investigations are generally time consuming. Quick means may be desirable for discriminating whether the failures have developed in a relatively low-voltage structure (RAM) definition sequence or in a high-voltage structure definition sequence of the fabrication process.

On another account, during mass production, device testing and memory repair (BISR) procedures based on the realization of dedicated built-in structures, should be as fast as possible for evident reasons of productivity. This desire intuitively contrasts with the desirability of generating discriminating failure information on embedded RAM and ROM arrays.

SUMMARY OF THE INVENTION

It is an object of the present invention to provide a more efficient and less cumbersome Built-In Self-Repair (BISR) circuitry for embedded RAMs in a device including also at least one nonvolatile memory array.

The complexity and burden of built-in self-repair (BISR) circuitry for distinct embedded RAMs of different sizes may be minimized according to the present invention by utilizing a single BIST structure for any number of distinct embedded memory arrays of different types and sizes.

Useful diagnostic information from the self-test and repair procedures at the end of the production process may be obtained by the ability of temporarily storing new generated redundancy addresses in a redundancy register of the BISR architecture without immediately storing them in a nonvolatile memory array of the device until substitution of all the faulty addresses by the use of the required redundancy structures has been verified. Practically, only in case of a successfully proved repair operation, all the redundancy addresses are finally stored in a nonvolatile memory array. In addition, according to such a selectable test-repair-store-re-test flow (Screening mode), the procedure includes a further final test of the memory array that has been tested and repaired that will indirectly produce, if the case, information on a possible malfunctioning of the nonvolatile memory in which the pre-verified redundancy addresses were finally recorded.

The speed of the BISR procedure during mass production (Industrial mode), besides from benefiting from the possibility of carrying out a check of effectiveness of the substitution of a failed physical address with a redundancy structure without yet having written the new redundancy address in the nonvolatile memory array, is further enhanced by the outstanding flexibility of the BISR architecture allowed by modification of the programming of the selected test and repair flow, as well as by the coverage of logic location checking of the array. This eventually leads to consideration of pertinent information derived from an in-depth failure analysis that the BISR architecture allows during the prototyping phase.

DETAILED DESCRIPTION OF THE PREFERRED EMBODIMENTS

Figure 1:
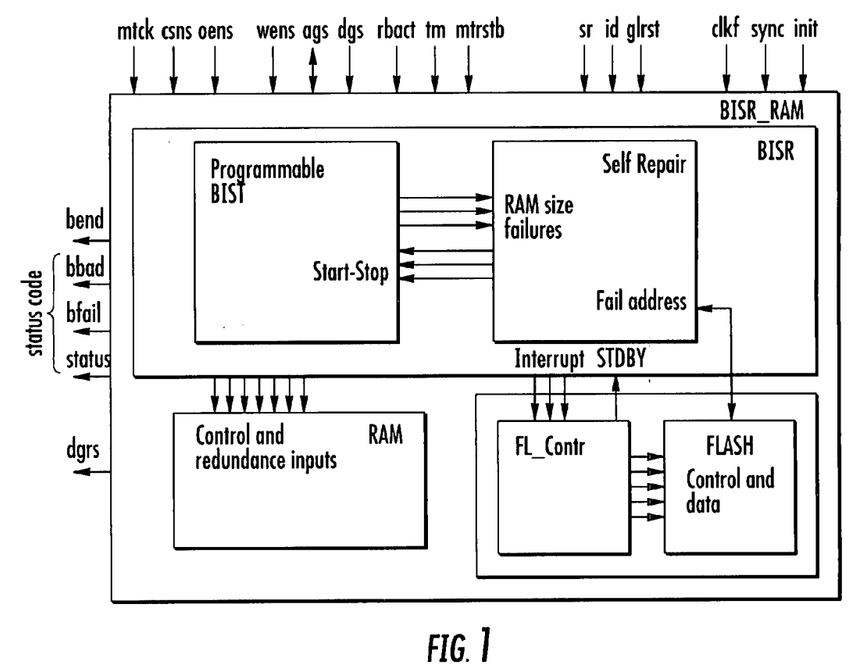
FIG. 1 shows a block diagram of the BISR of this invention.

The architecture of the BISR machine of the present invention is shown in the functional block diagram of FIG. 1. The core of the BISR machine is the SELF-REPAIR block, that manages the enabling of the single programmable BIST that is used for testing the currently selected memory array RAM, elaborates the redundancy information and transfers them to the correct input ports of the RAM array being tested and repaired, and manages the communication with the nonvolatile memory FLASH that eventually stores the substituted addresses of the RAM.

In the initial phase of a BISR session, the programmable BIST executes the test on the selected RAM by stimulating specific data pattern, related to a selected test algorithm. By reading the output data from the RAM and comparing them with the expected data, previously written in the memory under test and applied on the input memory ports by the programmable BIST, this allows the detection of any failing address and the identification of the failed bit within the word (byte) where the fault has been detected.

The programmability of the BIST block is normally related to the possibility of choosing different test algorithms, whose instructions are stored in a nonvolatile memory, (Program memory, for example in a ROM array). According to a preferred embodiment, such a nonvolatile memory further contains permanent information on the characteristics of the different memory arrays and in particular of all the distinct RAM arrays present in the device, such as in terms of their aspect ratio, capacity, size of address and data bus, multiplexing factor, scrambling parameters, and any other useful characteristic of the different arrays, all properly coded.

Figure 2:
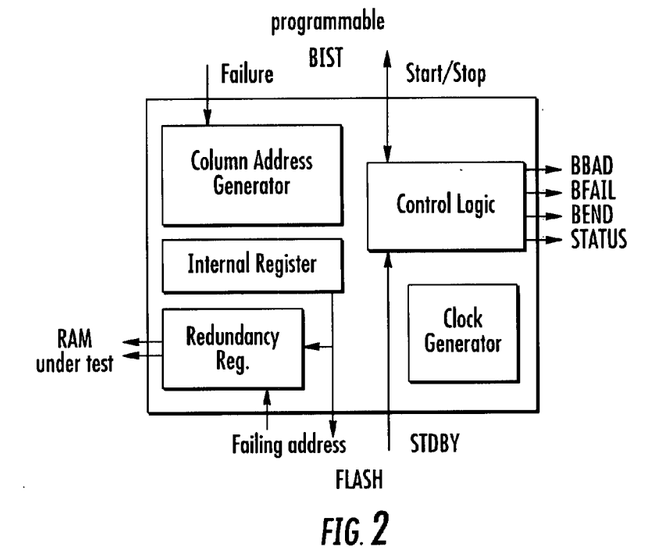
FIG. 2 shows the architecture of the Self-Repair block of the BISR of FIG. 1.

As shown in a more detailed functional block diagram of the SELF-REPAIR block of the BISR machine shown in FIG. 2, once the address containing a faulty cell (bit) is detected by the tests executed by the BIST block of the BISR architecture, it is transferred to the COLUMN ADDRESS GENERATOR of the SELF REPAIR block that elaborates such a logic address to generate the corresponding column address of the faulty bit. The COLUMN ADDRESS GENERATOR calculates the redundancy address for the RAM array under test in the device on the basis of the permanently stored characteristics of the relative array, starting from the sizes of the address and data buses and from the value of the parameter MUX. It will locate also in which bank of a divided array the failure has occurred to properly enable the required redundant resource of the array.

The redundancy information so elaborated is written in a first register, INTERNAL REGISTER. This INTERNAL REGISTER is always enabled during the entire test time of the memory array and is updated each time a failure is detected. From this first register the data may then be transferred either to the nonvolatile memory FLASH or directly to a second register, REDUNDANCY REGISTER, depending on the selected test mode as will be explained later in this description.

For example the second register REDUNDANCY REGISTER may be a 32-bit register, according to the convention of writing the failing column address for the bank A of the tested RAM array in the 16 less significant bits of the register and the failing column address for the bank B in the 16 most significant bits of the register.

The outputs of the REDUNDANCY REGISTER are connected to the redundancy ports of the RAM array under test, and for a fixed interval of time following every updating of this register, access to the memory array is interrupted. This is necessary to ensure a correct reconfiguration of the addresses.

The SELF-REPAIR block further includes two sub-blocks: the CONTROL LOGIC and the CLOCK GENERATOR.

The CONTROL LOGIC block manages the data transfer from the external world to the BISR and vice-versa, and controls the flow trough the different states that can be reached in the BISR machine during a BISR session.

In the CONTROL LOGIC block, a status code of three bits is generated that allows to monitor the process steps of the BISR machine. Such a status code is placed on the output ports, thus informing the external operator on the final results of the BISR session.

The CLOCK GENERATOR generates multiple frequency clocks that are selectable for enabling and providing the appropriate clock for the registers and for the communications with the nonvolatile memory array FLASH. Considering that SRAM and FLASH speeds differ significantly, such a feature of the clock generator of the BISR machine permits to exploiting the speed characteristics of the different types of memories to the fullest, with a noticeable reduction of the time of execution of each BIST session.

Preferably, two BISR procedures are available: Screening and Industrial.

The Screening mode includes the execution of a test by the BIST structure. During this test the column address for each detected fault is worked out. At the end of this test, the failed addresses are written in the redundancy register and a new BIST run is performed verifying the repairing of the RAM array.

Only in case of successful repair operation, the redundancy address information is finally stored into the nonvolatile memory FLASH. After that, a final test controls the correct functioning of the nonvolatile memory as well.

In case the Industrial mode is selected, the failed addresses are written into the nonvolatile memory immediately at the end of the first test and only a verification of the success of the repair operation is performed. This procedure is faster than the Screening mode, but less accurate because it does not allow detecting possible problems that may occur within the nonvolatile memory FLASH utilized for permanently storing the redundancy address information of the device.

Figure 3:
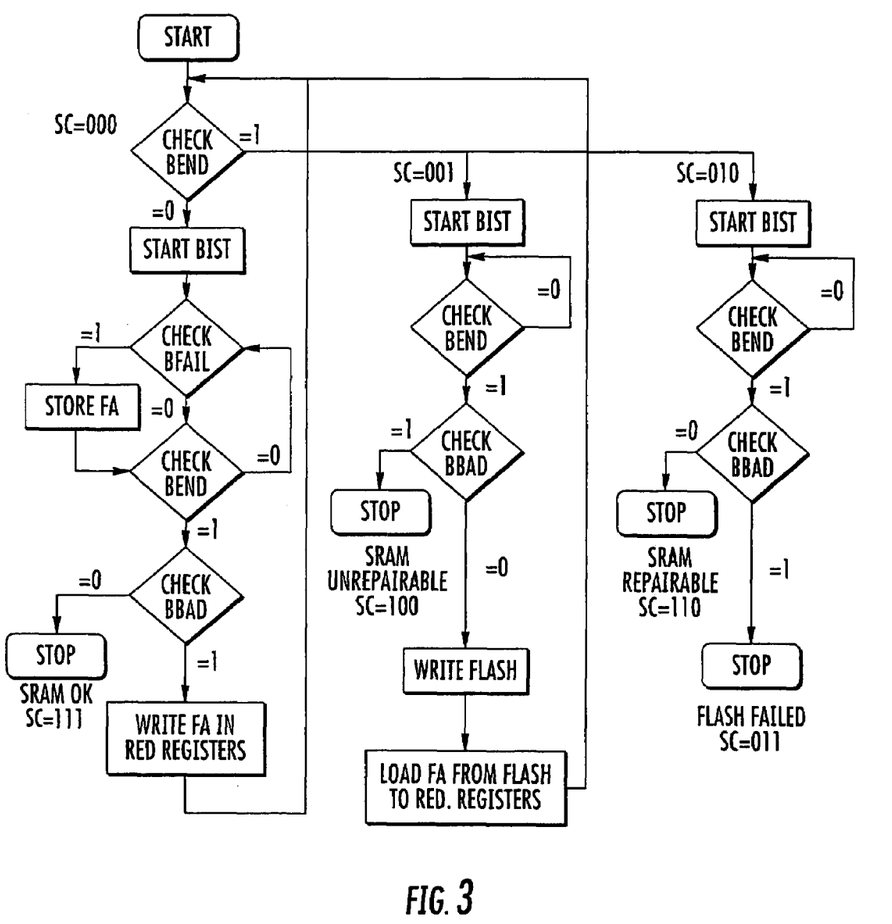
FIG. 3 illustrates the test flow of the BISR of this invention, according to the "Industrial" mode.

FIG. 3 illustrates the flow chart of a BISR session, according to the Screening mode. This flow represents the most complete.

Figure 4:
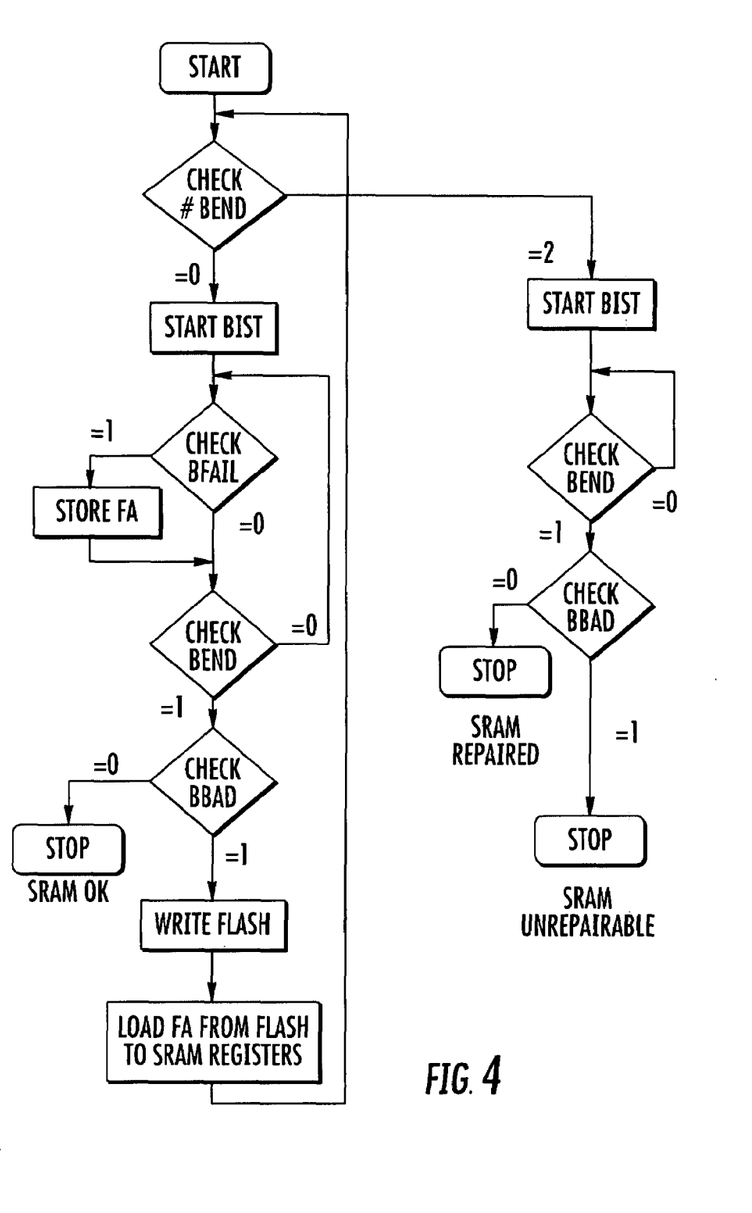
FIG. 4 illustrates the test flow of the BISR of this invention, according to the "Screening" mode.

The flow chart of a BISR session, according to the Industrial mode is illustrated in FIG. 4.

The Industrial flow diagram is derived from the Screening flow diagram by considering only the first and the third branch, but not the second branch that corresponds to the status code "001", and storing the fail address information in the nonvolatile memory FLASH at the end of the first test.

The number of the pins required by the whole single BISR machine is only five more than the number of pins that are required by a common programmable BIST structure of known devices. This modest increase of the number of dedicated pins appears a negligible burden if compared with the noticeable reduction of duplicated circuits and resources that were required and with the increased speed of execution of the BISR sessions.

The machine, as depicted in FIGS. 1 and 2, communicates with the external world through a limited number of dedicated pins: 7 inputs (SR, ID, GLRST, SYNC, INIT, RBACT, TM, MTRSTB) and 4 outputs (BBAD, BFAIL, BEND, STATUS. In practice, only 5 more pins than a normal dedicated BIST are used.

The RBACT (acronym for Run BIST Active) and TM (Test Mode) inputs select the BIST operating mode out of four possible modes. The SR input selects either the "Self-Repair" or the "BIST mode", while ID selects the "Industrial" or the "Screening" test flow.

The MTRSTB input is the Master Reset; GLRST is the overall power-on reset; INIT initialize the machine. Both synchronous and asynchronous FLASH memories can be accessed by the SYNC input.

In "BIST mode", the BFAIL (BIST Fail) output is set every time the BIST detects a failure inside the SRAM memory under test. The BBAD (BIST Bad) signal is set when the BIST detects the first failure and remains high until the end of the BIST execution.

In "Self-Repair mode", BBAD, BFAIL and STATUS output a code that monitors the machine status (during execution of a BISR session) or the result of the repair flow (at the end of BISR procedure), according to TABLE 1.

TABLE 1

| Status code | |
|---|---|
| Status code | Description |
| 000 | SRAM is under test |
| 001 | SRAM is tested (before FLASH programming) |
| 010 | SRAM is tested (after FLASH programming) |
| 011 | FLASH failure |
| 100 | SRAM is unrepairable due to too many defects |
| 101 | SRAM is unrepairable |
| 110 | SRAM is repaired |
| 111 | SRAM has no defects |

The BEND (BIST End) output is set whenever the BIST or BISR execution is completed.

The different blocks of the BISR machine are described herein below.

Programmable BIST

The single internal BIST of the BISR structure is able to test a SRAM array according to a stand-alone test flow or within a self-repair flow, to find faulty memory locations.

The BIST block is a programmable machine that can test SRAMs of size up to 64 kwords, ranging from 4 to 32 bits, and with different aspect ratios.

According to the embodiment shown, the BIST circuit includes a dedicated small micro-program ROM of 64×4 bits, that stores the information regarding the architecture of the of the arrays to be tested, address and data buses, aspect ratio, capacity, and the test algorithm instructions.

The sample embodiment implements several selectable test algorithms, namely the March 17N algorithm, a data retention algorithm, a PSF algorithm, and a WSF algorithm. New algorithms may be easily added, by simply modifying the ROM micro-programmed code.

Due to the widespread adoption of the March algorithms in SRAM testing, March-like instructions have been implemented. A modified Pattern Sensitive Fault (PSF) and a new Weight Sensitive Fault (WSF) algorithm have been developed by using only March-like instructions, while keeping a 100% fault coverage. This allows greatly reducing the BIST area overhead.

According to configuration of the input pins (TM and RBACT), the BIST can enter different functional modes. In Transparent mode, the BIST is inactive; the SRAM is directly accessible through the external standard address/data buses and control lines (e.g. Chip Select, Read/Write, Output Enable) and its outputs are visible on the chip external pins.

In BIST mode, the SRAM is controlled by the BIST, which performs the test using the selected algorithm and outputs whether the SRAM is good or faulty. In Test mode, the SRAM is disabled, while the BIST block may be tested by external test circuits.

Self-Repair

As already described above, the SELF-REPAIR block of the BISR included the following functional structures.

Control Logic

The Control Logic manages data transfer from the external electronics to the BISR and vice versa, and controls the flow of the state machine. The Control Logic generates the status code, shown in TABLE 1, for monitoring the process steps of the BISR machine.

Clock Generator

The Clock Generator block provides different clocks that may be selectively used. Because SRAM and FLASH speeds differ significantly, such a feature allows exploiting the maximum operating frequency ability of the various memory arrays to be accessed; thus reducing the time of BIST and BISR sessions.

Column Address Generator

Once the BIST algorithms detect a faulty location, the Column Address Generator processes its logic address to get its physical column position. The generator is able to calculate such redundancy address for different memory arrays, on the bases of address and data bus sizes, multiplexer value and scrambling information. The generator locates also in which bank the failure occurred to correctly allocate the redundant resources of the memory array.

Internal and Redundancy Registers

The redundancy information is written in the Internal Register each time a failure is detected. From this register the data can be transferred to the FLASH memory or directly to the Redundancy Register, according to the selected test flow.

At the end of the test, the Redundancy Register stores the final redundancy information, i.e. the physical column position of the failed cells. The outputs of this register are directly connected to the SRAM redundancy ports. At each power-on, the Redundancy Register is loaded with the FLASH memory-content.

The number of repairable cells depends only upon the available redundant resources, therefore the Redundancy Register is sized accordingly.

FLASH Memory

The redundancy addresses are permanently written into an on-chip FLASH memory. Only very few words inside the FLASH memory are devoted to the BISR purposes. Therefore any nonvolatile memory already available in the device, beside one or more RAM arrays, can be used for such purpose. In this way, area overhead is minimized, but suitable protocols may be devised for different types of FLASH memories.

To this end, a communication protocol for both synchronous and asynchronous FLASH, based on three interrupt signals fed to a microcontroller to control three different FLASH operating modes: read, program or wait has been devised. According to this protocol, a stand-by (STDBY) signal informs the Self-Repair that the nonvolatile memory is being accessed, thus momentarily stopping any operation on the RAM being tested.

During the initialization phase of the BISR machine, the user can specify the FLASH type (synchronous or asynchronous) and the read and program times (in terms of RAM clock pulses).

Test Flow and Algorithms

The BISR machine supports two different test flows. After initialization, the ID input signal selects the test flow: Industrial or Screening.

The "Industrial" flow includes of two phases, as shown in FIG. 3; both of them include a complete BIST run on the whole memory array. During the first run, the failing addresses are detected by the BIST, the corresponding physical column addresses are processed by the Self-Repair block and written into the FLASH memory. Eventually, this information is transferred to the SRAM inputs for activating the redundant columns. The second BIST run verifies that the repair operation has been correctly accomplished and outputs the corresponding status code (as listed in TABLE 1).

For diagnostic purposes, the BISR machine supports the execution of a more complex "Screening" flow as shown in FIG. 4 that includes three BIST runs. After the first run, the SRAM redundant structures are directly configured by the BISR Internal Register without writing the addresses in the FLASH memory.

A further failure at the end the second BIST run, would mean that the SRAM does not have enough redundancy resources available and it cannot be repaired. By contrast, if no failures are detected in the second run, the physical redundancy column addresses are written into the FLASH. A failure detected after the third BIST run would mean that the FLASH programming is faulty and the SRAM cannot be repaired.

The "Screening" flow is very useful during the early development work of a novel process technology, to correctly attribute the binning information to the low voltage structure fabrication, rather than to the nonvolatile memory cell fabrication process steps.

As far as the test algorithms are concerned, the BIST block is able to execute each March algorithm such as disclosed by Marinescu in "Simple and Efficient Algorithms for Functional RAM Testing", Proc. Int. Test Conf., pp. 236-239, 1982, that is the most widely used in memories testing. It requires the execution of a sequence of read and write operations into every cell of the memory array, in either increasing or decreasing address order. Such operations are repeated for several data patterns.

The basic operating codes (op-codes) of the BIST are read and write instructions. For example Write0 tells the BIST to write the current test vector into the SRAM under test; instead Write1 writes the negative of the current test vector into the memory.

The Read0 and Read1 instructions tell the BIST to read data from the SRAM and to check, via the digital comparator, the evenness of the operation, i.e. if read data is equal to the current test vector (Read0) or to its negate (Read1).

Some additional instructions can be added to op-codes: inc and dec tell the BIST to increment or decrement the current address during the same clock cycle of the read or write instruction; jump branches to a previous instruction. As an example, the op-code Write0, inc&jump (3) executes a Write0 operation and then increments the current address and decrements by 3 the Program Counter (PC). Eventually there are op-codes for simple increment (incac) or decrement (decac) of the current address, or for changing the current test vector (incdg).

As an example, TABLE 2 shows the March 6N algorithm, which execute six operations on each memory word, either in increasing or decreasing address order

TABLE 2

March 6N algorithm

| Instruction | Op-code |
|---|---|
| March_select | 001000 |
| Write0,inc | 011100 |
| Disable | 000011 |
| Read0 | 000110 |
| Write1,inc&jump(1) | 101100 |
| Disable | 000011 |
| Read1,inc | 011111 |
| Incdg | 010000 |

The meaning of the symbols is the following:
W(D): write data D into memory;
R(D): read and check if data is as expected (D);
W(I): write data I (inverse) into memory; and
R(I): read and check if data is as expected (I).

The algorithm scans the whole memory with the data pattern D, according to the listed operations, then the scan is repeated with different value of D.

March algorithm versions differ from each other by the number of operations executed on each memory word. However, their overall complexity is always linearly proportional to the number of memory words. All of them can be executed by the programmable BIST, by simply changing the microprogrammed ROM code. Moreover new algorithms can be easily added, according to the most frequently encountered fault models.

Simulations and Results

Figure 5:
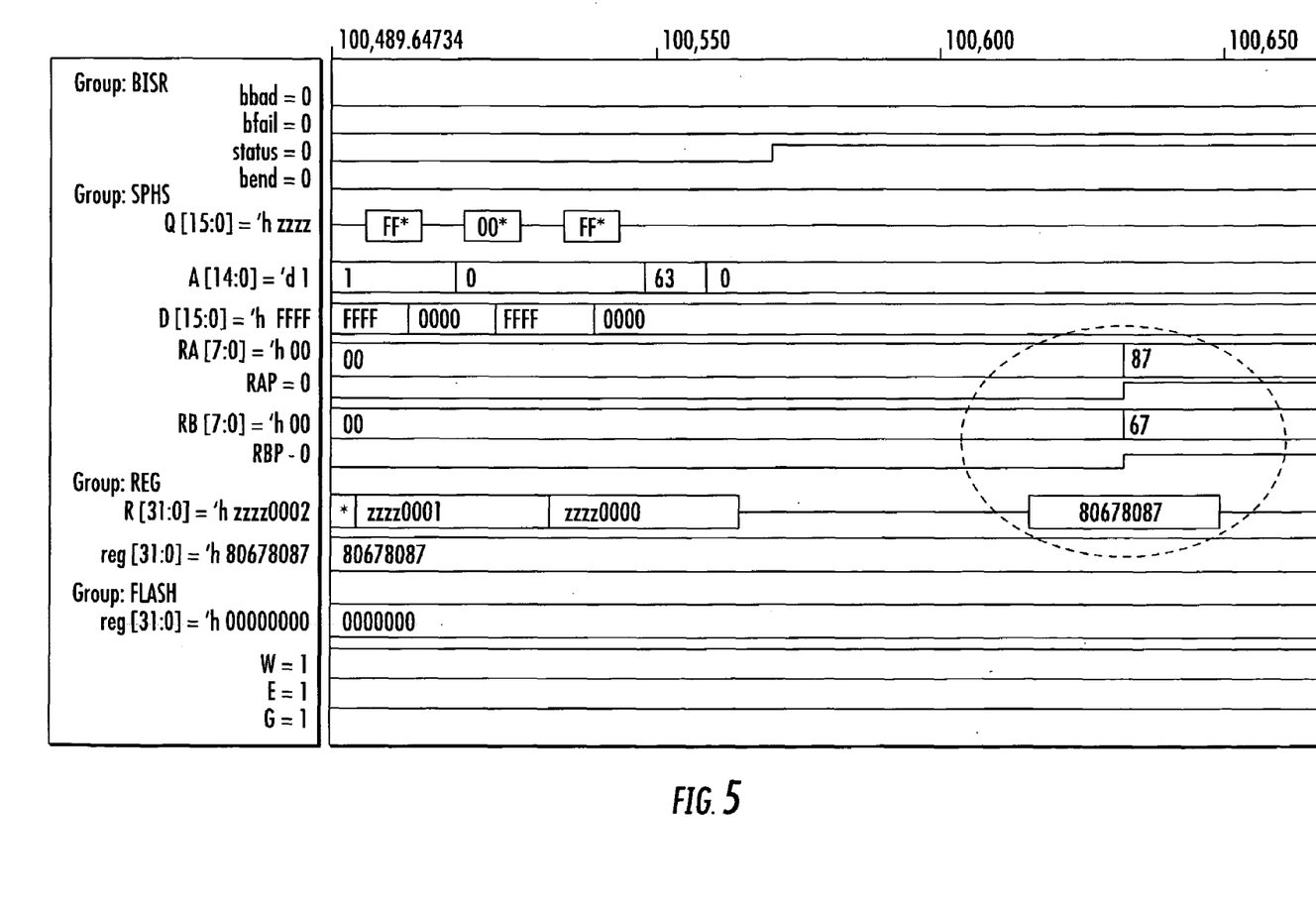
FIG. 5 shows simulation diagrams of the significant signals of this invention, according to the "Screening" test flow, in which two failures have been detected and two repair data are being written.

FIG. 5 shows simulation diagrams of the significant signals, according to the "Screening" test flow, in which two failures have been detected and two repair data are being written. The physical column addresses are transferred from the Internal Register to the input ports of the SRAM under test after the first BIST run of the "Screening" flow.

Figure 6:
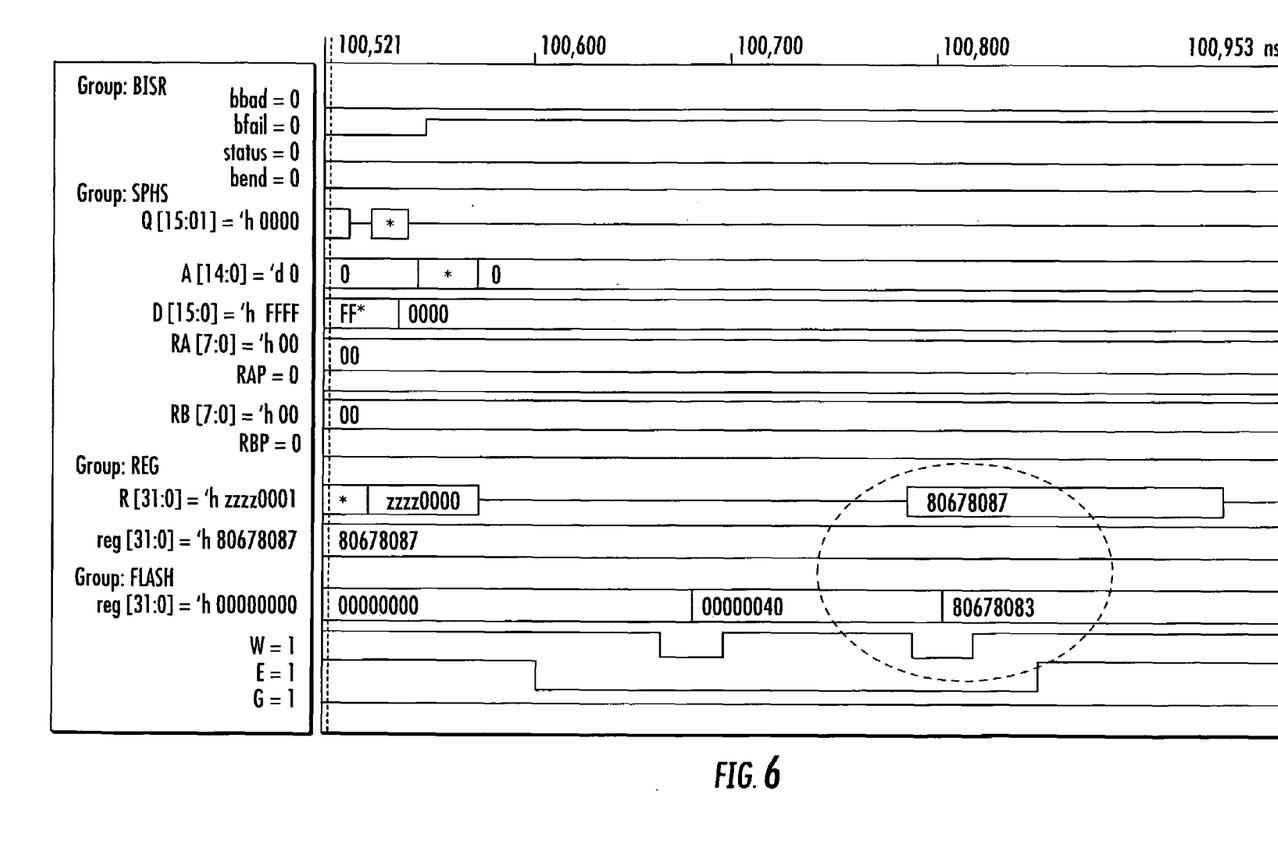
FIG. 6 shows simulation diagrams of the significant signals of this invention, according to the "Industrial" test flow, in which the Internal Register is written into the FLASH and a stuck-at fault in the FLASH causes a wrong write operation (see the last digit of the word), that will be eventually detected by a next BIST run.

FIG. 6 shows simulation diagrams of the significant signals, according to the "Industrial" test flow, in which the pre-verified content of the Internal Register is written into the FLASH and a stuck-at fault in the FLASH causes a wrong write operation (see the last digit of the word), a failure that will be detected by the second BIST run, contemplated by the "Industrial" flow. As can be seen, a stuck-at fault in the FLASH memory impairs the repair operation.

Figure 7:
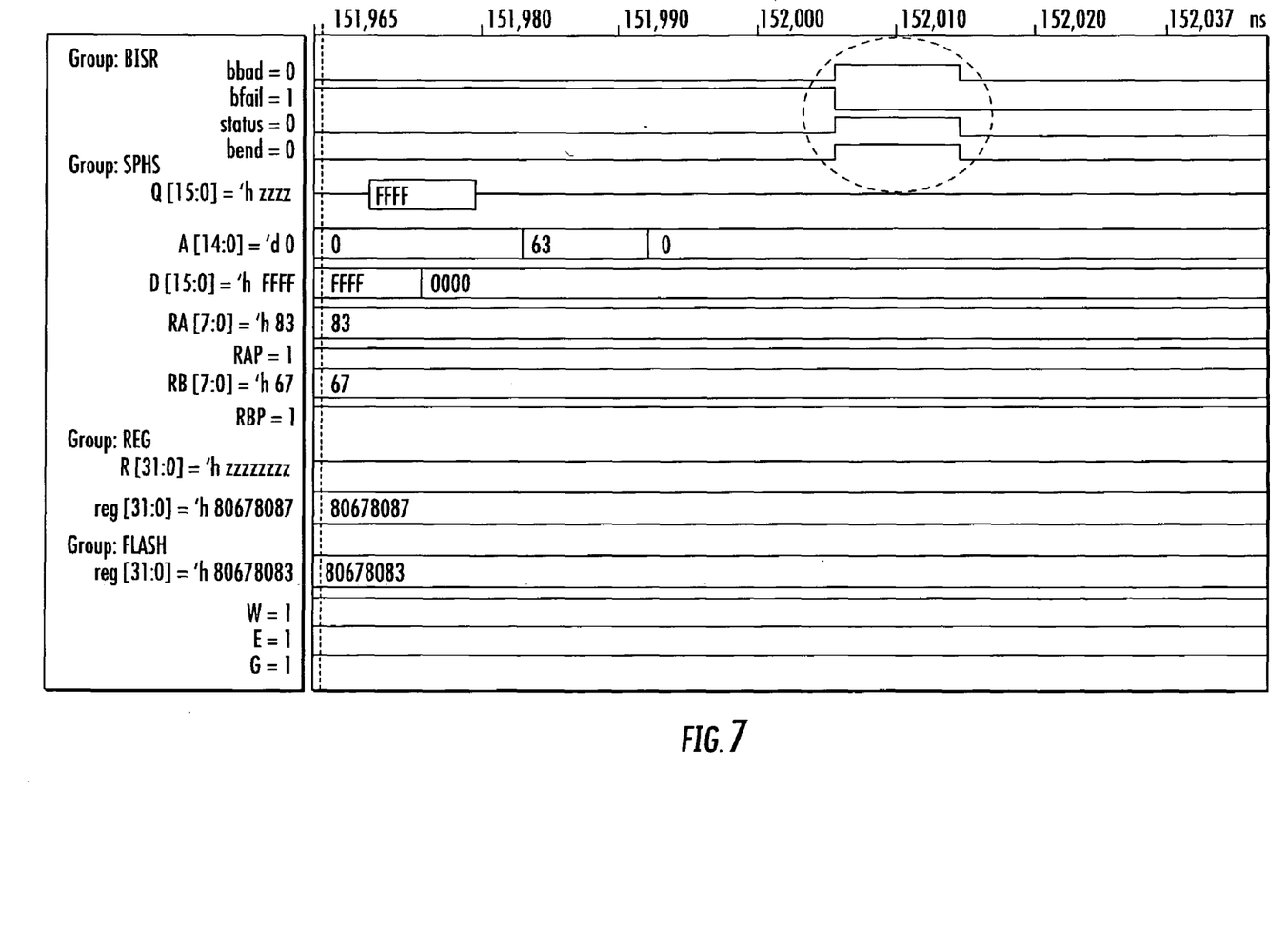
FIG. 7 shows simulation diagrams of the significant signals of this invention resulting in the generation of the code: "FLASH failure" (SC=011), because of a stuck-at fault occurred in the nonvolatile memory.

The next BIST run shown in FIG. 7, detects the failure and outputs the corresponding status code 011 (i.e. FLASH failure) on the BBAD, BFAIL and STATUS output bits. To estimate the overall repair time, the FLASH memory was replaced by registers and simulation of the "Industrial" flow was performed, according to which the Internal Register is written into the FLASH. In this "Industrial" mode, a stuck-at fault in the FLASH will cause a wrong write operation (see the last digit of the word) that will be detected by a next BIST run. Therefore, the result of the "Screening" flow is "FLASH failure" (SC=011) because of a stuck-at fault inside the nonvolatile device.

With a 0.5 Mbit SRAM, the "Industrial" flow takes 3,342,356; 11,796,500; 201,326,612 and 403,439,636 clock cycles with the March17N, the PSF, the WSF, and the Data Retention algorithms, respectively.

In TABLE 3 are listed the number of SRAM clock cycles and the time taken by the BISR sessions depending on the selected mode and the selected test algorithm.

| BISR Flow | Test Algorithm | SRAM clock Cycles | Time [ms] |
|---|---|---|---|
| "Industrial Mode" | March 17N | 3,342,356 | 13.37 |
| | PSF | 11,796,500 | 47.19 |
| | WSF | 201,326,612 | 805.3 |
| | Data retention | 403,439,636 | 1613.76 |
| "Screening Mode" | March 17N | 5,013,570 | 19.59 |
| | PSF | 17,694,740 | 70.78 |
| | WSF | 301,989,948 | 1207.96 |
| | Data retention | 605,159,484 | 2420.64 |

Figure 8:
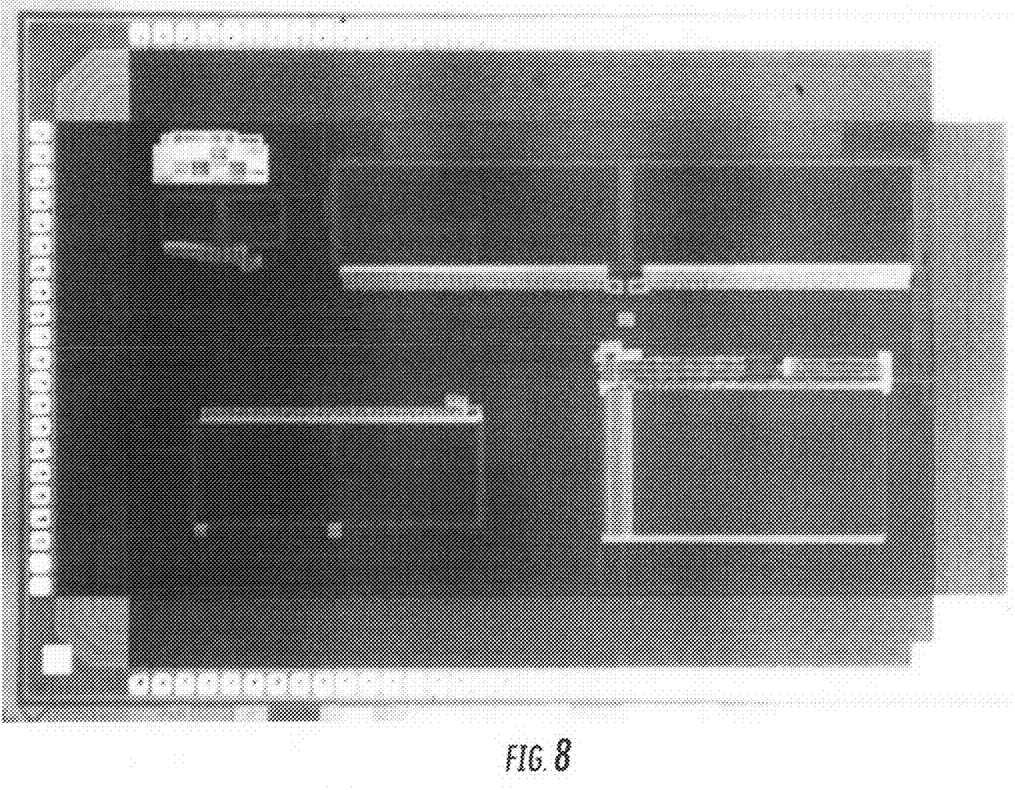
FIG. 8 is a microphotograph of the sample chip used for testing the BISR machine of this invention.

FIG. 8 is a microphotograph of the test chip containing the BISR machine fabricated in a 0.13 μm FLASH technology with six metal layers. The 112,549 μm$^2$ BISR dimensions lead to a quite small area overhead, corresponding to 3% of a 0.5 Mbit SRAM. The BISR can run at a frequency of 250 MHz, even if higher speeds can be reached by implementation of pipeline architectures.

In a second prototype of the BISR machine connected to a 0.5 Mbit SRAM with 32 spare columns (one column for each bit). The area of the BISR machine was 136,165 μm$^2$ due to the overhead from the additional registers and logic gates needed to manage the redundancy structures available.

The Built-In Self Repair (BISR) machine has been realized in a 0.13 μm FLASH technology. It uses five pins more than a standard BIST and its area occupation is 1.8 mm$^2$ (3% of a 0.5 Mbit SRAM). Its maximum operating frequency is 250 MHz and it can test and repair RAM arrays up to 2 Mbit with two selectable different test and repair flows ("Industrial" or "Screening"). The area overhead of the BISR machine is remarkably small.

That which is claimed is:

1. A built-in self-test and self-repair (BISR) structure for a plurality of different memory arrays embedded in an integrated device, the different memory arrays being different in at least one of type and size, the BISR structure comprising:
   a built-in self-test (BIST) block programmable to execute at least one test algorithm on each different memory array;
   a self-repair block processing fault address information for allocating redundant resources, a nonvolatile memory on which final redundancy address information is stored, a redundancy register loaded at each power-on with the final redundancy address information and a controller for managing data transfer with external circuitry;
   a nonvolatile memory containing information on at least one of logic addresses and data bus size, aspect ratio, capacity, multiplexing and scrambling parameters and corresponding test algorithm instructions for each of the different memory arrays; and
   a multiple frequency clock generator for providing a respective operating clock frequency for each different memory array.

2. The BISR structure according to claim 1 wherein said self-repair block comprises a column address generator.

3. The BISR structure according to claim 1 wherein said BIST, self-repair block and said nonvolatile memory support a plurality of selectable test and repair flows comprising:
   a first flow, each step of which includes execution of a complete test on each memory array; and a second flow, each step of which includes execution of a complete test on each memory array with a last step revealing possible failed programming of redundancy address information in said nonvolatile memory.

4. The BISR structure according to claim 3 wherein according to said first flow redundancy address information is generated and recorded in said nonvolatile memory and wherein a subsequent complete test verifies correctness of the repair.

5. The BISR structure according to claim 3 wherein according to said second flow during a first step, redundancy address information is generated and directly recorded in a redundancy register; any failure detected during a second test indicates exceeding the redundancy resources available, and if not, the generated redundancy address information temporarily stored in said redundancy register is permanently recorded in said nonvolatile memory; and any eventual failure detected during a third test indicates a faulty programming of said nonvolatile memory.

6. The BISR structure according to claim 1 further comprising output pins; and wherein said control logic generates a status code monitoring a process flow of each session that is placed on said output pins.

7. The BISR structure according to claim 1 wherein said nonvolatile memory is either of synchronous or asynchronous type accessible with a same communication protocol based on a plurality of interrupt signals for a microcontroller for controlling different a read mode, a program mode and a wait mode; and wherein said control logic generates a stand-by signal for stopping any test and repair operation while accessing said nonvolatile memory.

8. An integrated circuit comprising:
a plurality of different memory arrays being different in at least one of type and size; and
a built-in self-test and self-repair (BISR) structure comprising
a built-in self-test (BIST) block programmable to execute at least one test algorithm on each different memory array,
a self-repair block processing fault address information for allocating redundant resources, a nonvolatile memory on which final redundancy address information is stored, a redundancy register loaded at each power-on with the final redundancy address information and a controller for managing data transfer with external circuitry, and
a nonvolatile memory containing information on at least one of logic addresses and data bus size, aspect ratio, capacity, multiplexing and scrambling parameters and corresponding test algorithm instructions for each of the different memory arrays.

9. The integrated circuit according to claim 8 wherein said BISR further comprises a multiple frequency clock generator for providing a respective operating clock frequency for each different memory array.

10. The integrated circuit according to claim 8 wherein said self-repair block comprises a column address generator.

11. The integrated circuit according to claim 8 wherein said BIST, self-repair block and said nonvolatile memory support a plurality of selectable test and repair flows comprising:
a first flow, each step of which includes execution of a complete test on each memory array; and
a second flow, each step of which includes execution of a complete test on each memory array with a last step revealing possible failed programming of redundancy address information in said nonvolatile memory.

12. The integrated circuit according to claim 11 wherein according to said first flow redundancy address information is generated and recorded in said nonvolatile memory and wherein a subsequent complete test verifies correctness of the repair.

13. The integrated circuit according to claim 11 wherein according to said second flow during a first step, redundancy address information is generated and directly recorded in a redundancy register; any failure detected during a second test indicates exceeding the redundancy resources available, and if not, the generated redundancy address information temporarily stored in said redundancy register is permanently recorded in said nonvolatile memory; and any eventual failure detected during a third test indicates a faulty programming of said nonvolatile memory.

14. The integrated circuit according to claim 11 further comprising output pins; and wherein said control logic generates a status code monitoring a process flow of each session that is placed on said output pins.

15. The integrated circuit according to claim 8 wherein said nonvolatile memory is either of synchronous or asynchronous type accessible with a same communication protocol based on a plurality of interrupt signals for a microcontroller for controlling different a read mode, a program mode and a wait mode; and wherein said control logic generates a stand-by signal for stopping any test and repair operation while accessing said nonvolatile memory.

16. An integrated circuit comprising:
a plurality of different memory arrays; and
a built-in self-test and self-repair (BISR) structure comprising
a built-in self-test (BIST) block programmable to execute at least one test algorithm on each different memory array,
a self-repair block processing fault address information for allocating redundant resources, and a nonvolatile memory on which final redundancy address information is stored, and
a nonvolatile memory containing information on at least one parameter and corresponding test algorithm instructions for each of the different memory arrays.

17. The integrated circuit according to claim 16 wherein said BISR further comprises a multiple frequency clock generator for providing a respective operating clock frequency for each different memory array.

18. The integrated circuit according to claim 16 wherein said BIST, self-repair block and said nonvolatile memory support a plurality of selectable test and repair flows comprising:
a first flow, each step of which includes execution of a complete test on each memory array; and
a second flow, each step of which includes execution of a complete test on each memory array with a last step revealing possible failed programming of redundancy address information in said nonvolatile memory.

19. The integrated circuit according to claim 18 wherein according to said first flow redundancy address information is generated and recorded in said nonvolatile memory and wherein a subsequent complete test verifies correctness of the repair.

* * * * *

UNITED STATES PATENT AND TRADEMARK OFFICE
CERTIFICATE OF CORRECTION

PATENT NO. : 7,284,166 B2  Page 1 of 1
APPLICATION NO. : 11/197989
DATED : October 16, 2007
INVENTOR(S) : Zappa et al.

It is certified that error appears in the above-identified patent and that said Letters Patent is hereby corrected as shown below:

| | |
|---|---|
| On the Title Page Item (75) | Delete: "sul" Insert: -- Sul -- |
| Column 4, Line 66 | Delete: "trough" Insert: -- through -- |
| Column 6, Lines 43-44 | Delete: "of the of the" Insert: -- of the -- |
| Column 8, Line 5 | Delete: "of two" Insert: -- two -- |
| Column 8, Line 23 | Delete: "end the" Insert: -- end of the -- |
| Column 8, Line 66 | Delete: "execute" Insert: -- executes -- |
| Column 8, Line 67 | Delete: "order" Insert: -- order. -- |
| Column 9, Line 22 | Delete: "with different" Insert: -- with a different -- |

Signed and Sealed this

Twenty-fourth Day of June, 2008

JON W. DUDAS
*Director of the United States Patent and Trademark Office*